(12) United States Patent
Chen

(10) Patent No.: US 6,229,185 B1
(45) Date of Patent: May 8, 2001

(54) CMOS INTEGRATED CIRCUIT FOR LESSENING LATCH-UP SUSCEPTIBILITY

(75) Inventor: Wei-Fan Chen, Taichung (TW)

(73) Assignee: Winbond Electronics Corp., Hsinchu (TW)

( * ) Notice: Subject to any disclaimer, the term of this patent is extended or adjusted under 35 U.S.C. 154(b) by 0 days.

(21) Appl. No.: 09/241,493

(22) Filed: Feb. 1, 1999

(30) Foreign Application Priority Data

Jul. 7, 1998 (TW) .................................. 87111005

(51) Int. Cl.[7] .......................... H01L 29/76; H01L 29/94; H01L 31/062; H01L 31/113; H01L 31/119
(52) U.S. Cl. .......................... 257/372; 257/371; 257/369; 257/373; 257/376
(58) Field of Search .................. 257/372, 373, 257/369, 376, 377, 355, 356, 371, 375

(56) References Cited

U.S. PATENT DOCUMENTS

| 4,152,717 | * | 5/1979 | Satou et al. | 257/373 |
| 4,327,368 | * | 4/1982 | Uchida | 257/369 |
| 4,947,227 | | 8/1990 | Teng . | |
| 5,083,179 | * | 1/1992 | Chong et al. | 257/369 |
| 5,306,939 | * | 4/1994 | Mitani et al. | 257/372 |
| 5,338,986 | | 8/1994 | Kurimoto . | |

FOREIGN PATENT DOCUMENTS

358218160 * 12/1983 (JP) ...................................... 257/372

* cited by examiner

Primary Examiner—Mahshid Saadat
Assistant Examiner—Jesse A. Fenty
(74) Attorney, Agent, or Firm—Ladas & Parry

(57) ABSTRACT

A CMOS integrated circuit is formed on a P-type semiconductor layer and an N-type semiconductor layer in contact with the P-type semiconductor layer to establish a junction therebetween. A PMOS transistor is formed on the N-type semiconductor layer and configured with its source terminal connected to a first voltage source. An N-type contract region is formed in the N-type semiconductor layer and connected to the first voltage source. An NMOS transistor is formed on the P-type semiconductor layer and configured with its source terminal connected to a second voltage source. A P-type contact region is formed in the P-type semiconductor layer and connected to the second voltage source. Moreover, a P-type carrier-releasing region is provided with one portion formed in the N-type semiconductor layer and another portion formed in the P-type semiconductor layer to span the junction.

16 Claims, 1 Drawing Sheet

CMOS INTEGRATED CIRCUIT FOR LESSENING LATCH-UP SUSCEPTIBILITY

BACKGROUND OF THE INVENTION

1. Field of the Invention

The present invention generally relates to semiconductor integrated circuit technology. More particularly, the present invention relates to a CMOS integrated circuit for lessening latch-up susceptibility.

2. Description of the Related Art

Although CMOS-based integrated circuitry is characterized by low-power consumption and high-density integration, devices such as transistors or resistors parasitic onto semiconductor substrates raise a reliability issue to be considered. Referring to FIG. 1, a conventional CMOS circuit fabricated onto a semiconductor substrate is schematically illustrated in a cross-sectional view. In the drawing, reference numeral 10 denotes a P-type semiconductor substrate in which an N-well 11 is provided. A PMOS transistor 12 is formed on the N-well 11, whereas an NMOS transistor 13 is formed on the P-type semiconductor substrate 10. An N-type doped region 14 and a P-type doped region 15 are formed in the N-well 11 and the P-type semiconductor substrate 10 to form the contact regions, respectively.

In FIG. 1, a pair of spaced apart P-type doped regions 12S and 12D serve as the source and the drain of the PMOS transistor 12, while its gate 12G is disposed to cover a portion of the N-well 11 between the source 12S and the drain 12D. A pair of spaced apart N-type doped regions 13S and 13D serve as the source and the drain of the NMOS transistor 13, while its gate 13G is disposed to cover a portion of the P-type semiconductor substrate 10 between the source 13S and the drain 13D. The PMOS transistor 12 is configured with the gate 12G electrically connected to the gate 13G of the NMOS transistor 13 to form an input terminal $V_{IN}$, while the drains 12D and 13D are tied together to form an output terminal $V_{OUT}$. Both the source 12S of the PMOS transistor 12 and the N-type doped region 14 are powered by a voltage source $V_{DD}$, and the source 13S of the NMOS transistor 13 and the P-type doped region 15 is powered by another voltage source $V_{SS}$.

As shown in FIG. 1, the source 12S of the PMOS transistor 12, N-well 11, and P-type semiconductor substrate 10 constitute the emitter, base, and collector of a parasitic PNP bipolar junction transistor $Q_1$, respectively. Moreover, the source 13S of the NMOS transistor 13, P-type semiconductor substrate 10, and N-well 11 constitute the emitter, base, and collector of a parasitic NPN bipolar junction transistor $Q_2$, respectively. In the drawing, $R_W$ designates one parasitic resistor spread over the N-well 11, and $R_{SUB}$ designates another parasitic resistor spread over the P-type semiconductor substrate 10.

However, when a voltage level higher than $V_{DD}$ or lower than $V_{SS}$ occurs at the output terminal $V_{OUT}$ on account of interference or noise, the emitter-base junctions of the parasitic transistors $Q_1$ and $Q_2$ will enter forward bias to conduct a current flowing therethrough. Even worse, the path between $V_{DD}$ and $V_{SS}$ is short-circuited so as to cause permanent damage to the integrated circuit. This is the so-called latch-up effect.

U.S. Pat. No. 4,947,227 discloses a latch-up resistant CMOS structure achieved by patterning a semiconductor substrate into a trench, on the inside surface of which an oxide insulating layer is thermally grown. Thereafter, amorphous silicon or polysilicon is deposited on the surface of the semiconductor and substantially fills the trench to form a well region. However, grain boundaries contained in the amorphous silicon or polysilicon will deteriorate the carrier mobility of transistors fabricated within such a well region.

In addition, U.S. Pat. No. 5,338,986 discloses a latch-up resistant CMOS output circuit achieved by increasing the source-gate spacing to dispose a resistance device at the source of the PMOS transistor or NMOS transistor and thus reduce the collector current of the parasitic transistor. However, U.S. Pat. No. 5,338,986 merely takes minority carriers into account, but secondary triggering induced by majority carriers results in a low holding-voltage and possibly a short-circuit of $V_{DD}$–$V_{SS}$ causing permanent damage to the integrated circuit.

SUMMARY OF THE INVENTION

It is therefore an object of the present invention to provide a CMOS integrated circuit for lessening latch-up susceptibility.

The above object of the present invention can be accomplished with a CMOS integrated circuit. According to the present invention, the CMOS integrated circuit is formed on a P-type semiconductor layer and an N-type semiconductor layer in contact with the P-type semiconductor layer to establish a junction therebetween. A PMOS transistor is formed on the N-type semiconductor layer and configured with its source terminal connected to a first voltage source. An N-type contact region is formed in the N-type semiconductor layer and connected to the first voltage source. An NMOS transistor is formed on the P-type semiconductor layer and configured with its source terminal connected to a second voltage source. A P-type contact region is formed in the P-type semiconductor layer and connected to the second voltage source. Moreover, a P-type carrier-releasing region is provided with one portion formed in the N-type semiconductor layer and another portion formed in the P-type semiconductor layer to span the junction.

Therefore, the CMOS integrated circuit according to the present invention utilizes the P-type carrier-releasing region 27 as a majority-carrier guard ring as well as a minority-carrier guard ring. Even upon the occurrence of secondary triggering, higher holding voltage can be sustained because the P-type carrier-releasing region 27 acts as the majority-carrier guard ring. Therefore, $V_{DD}$–$V_{SS}$ is not short-circuited and the integrated circuit is protected from permanent damage, thus lessening the latch-up susceptibility.

BRIEF DESCRIPTION OF DRAWINGS

The following detailed description, given by way of examples and not intended to limit the invention to the embodiments described herein, will best be understood in conjunction with the accompanying drawings, in which.

DETAILED DESCRIPTION OF THE INVENTION

Figure 1:
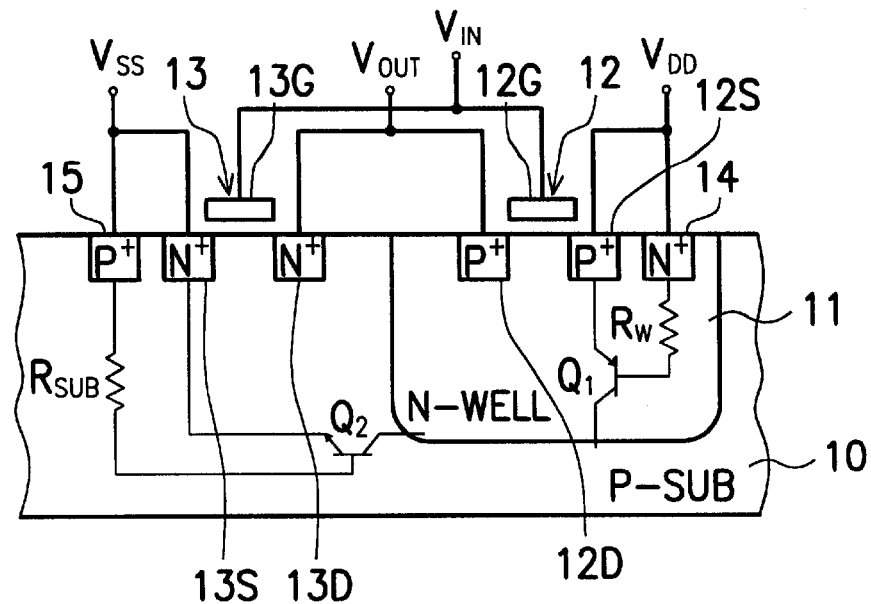
FIG. 1 schematically illustrates a cross-sectional diagram of a conventional CMOS circuit fabricated onto a semiconductor substrate.
Figure 2:
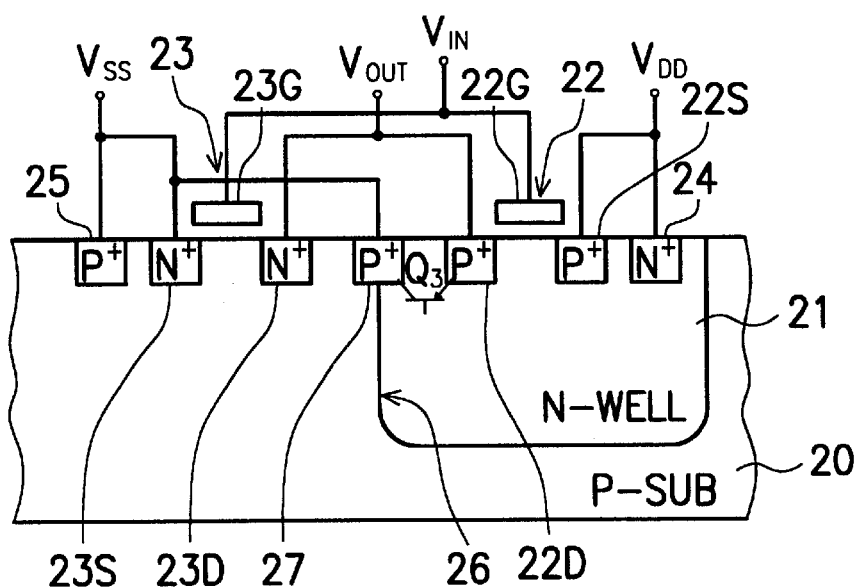
FIG. 2 schematically illustrates a cross-sectional diagram of one preferred embodiment of a CMOS circuit in accordance with the present invention fabricated onto a semiconductor substrate.

Referring to FIG. 2, one preferred embodiment of a MOS circuit according to the present invention fabricated onto a semiconductor substrate is schematically illustrated in a cross-sectional view. In FIG. 2, a P-type semiconductor layer 20 is in contact with an N-type semiconductor layer 21 to establish a P/N junction 26 therebetween. In this embodiment, a P-type semiconductor substrate (e.g., silicon substrate) is exemplified as the P-type semiconductor layer 20; an N-well formed in the P-type semiconductor substrate being exemplified as the N-type semiconductor layer 21. Of course, the N-type semiconductor layer 21 can be an N-type semiconductor substrate on which a P-well is formed as the P-type semiconductor layer 20. In addition, the P-type semiconductor layer 20 and the N-type semiconductor layer 21 can be a P-well and an N-well formed in the same semiconductor substrate, respectively.

As shown in FIG. 2, a PMOS transistor 22 is formed on the N-well 21, whereas an NMOS transistor 23 is formed on the P-type semiconductor substrate 20. An N-type doped region 24 and a P-type doped region 25 are formed in the N-well 21 and the P-type semiconductor substrate 20 to form contact regions, respectively.

In FIG. 2, a pair of spaced apart P-type doped region 22S and 22D serve as the source and the drain of the PMOS transistor 22, while its gate 22G is disposed to cover a portion of the N-well 21 between the source 22S and the drain 22D. A pair of spaced apart N-type doped regions 23S and 23D serve as the source and the drain of the NMOS transistor 23, while its gate 23G is disposed to cover a portion of the P-type semiconductor substrate 20 between the source 23S and the drain 23D. The PMOS transistor 22 is configured with the gate 22G electrically connected to the gate 23G of the NMOS transistor 23 to form an input terminal $V_{IN}$, while the drains 22D and 23D are tied together to form an output terminal $V_{OUT}$. Both the source 22S of the PMOS transistor 22 and the N-type doped region 24 are powered by the voltage source $V_{DD}$, and the source 23S of the NMOS transistor 23 and the P-type doped region 25 are powered by the voltage source $V_{SS}$. Usually, $V_{DD}$ is about 5V or 3.3V, and $V_{SS}$ is about 0V.

According to the present invention, a P-type carrier-releasing region 27 is provided with one portion formed in the P-type semiconductor layer 20 and another portion formed in the N-type semiconductor layer 21. In other words, the P-type carrier-releasing region 27 spans the P/N junction 26 between the P-type semiconductor layer 20 and the N-type semiconductor layer 21. Moreover, the P-type carrier-releasing region 27 is connected to the voltage source $V_{SS}$.

The operation of the CMOS circuit will be described with reference to FIG. 2 as follows.

When an voltage impulse lower than $V_{SS}$ occurs at the output terminal $V_{OUT}$ on account of interference or noise, the junction between the drain 23D of the NMOS transistor 23 and the P-type semiconductor layer 20 enters forward bias and thus generates majority carriers, e.g., holes that will be discharged to $V_{SS}$ through the P-type carrier-releasing region 27.

According to the present invention, the drain 22D of the PMOS transistor 22, the N-type semiconductor layer 21, and the P-type carrier-releasing region 27 constitute the emitter, base, and collector of a lateral PNP bipolar junction transistor $Q_3$, respectively. Accordingly, when an voltage impulse higher than $V_{DD}$ occurs at the output terminal $V_{OUT}$ on account of interference or noise, the junction between the drain 22D of the PMOS transistor 22 and the N-type semiconductor layer 21 enters forward bias and thus generates minority carriers-holes which will be discharged to $V_{SS}$ through the P-type carrier-releasing region 27. In other words, the minority carriers can flow through the transistor $Q_3$ instead of flowing through the parasitic PNP bipolar junction transistor constituted by the source 22S, the N-type semiconductor layer 21, and the P-type semiconductor layer 20.

Therefore, the CMOS integrated circuit according to the present invention utilizes the P-type carrier-releasing region 27 as a majority-carrier guard ring as well as a minority-carrier guard ring. Even upon the occurrence of secondary triggering, higher holding voltage can be sustained because the P-type carrier-releasing region 27 acts as the majority-carrier guard ring. Therefore, $V_{DD}$–$V_{SS}$ is not short-circuited and the integrated circuit is protected from permanent damage so as to lessen the latch-up susceptibility.

While the invention has been described with reference to various illustrative embodiments, the description is not intended to be construed in a limiting sense. Various modifications of the illustrative embodiments, as well as other embodiments of the invention, will be apparent to those person skilled in the art upon reference to this description. It is therefore contemplated that the appended claims will cover any such modifications or embodiments as may fall within the scope of the invention defined by the following claims and their equivalents.

What is claimed is:

1. A CMOS integrated circuit, comprising:
   a P-type semiconductor layer;
   an N-type semiconductor well provided in said P-type semiconductor layer to form a junction therebetween;
   a PMOS transistor formed in said N-type semiconductor well, said PMOS transistor having its source terminal connected to a first voltage source;
   an N-type contact region formed in said N-type semiconductor layer and connected to said first voltage source;
   an NMOS transistor formed on said P-type semiconductor layer, and NMOS transistor having its source terminal connected to a second voltage source;
   a P-type contact region formed in said P-type semiconductor layer and connected to said second voltage source; and
   a P-type carrier-releasing region having one portion formed in said N-type semiconductor well and another portion formed in said P-type semiconductor layer to span said junction.

2. The CMOS integrated circuit as claimed in claim 1, wherein said first voltage source has a voltage level greater than said second voltage source.

3. The CMOS integrated circuit as claimed in claim 1, wherein said PMOS and NMOS transistors have their gate terminals connected together to form an input terminal.

4. The CMOS integrated circuit as claimed in claim 1, wherein said PMOS and NMOS transistors have their drain terminals connected together to form an output terminal.

5. The CMOS integrated circuit as claimed in claim 1, wherein said P-type semiconductor layer is a P-type semiconductor substrate.

6. The CMOS integrated circuit as claimed in claim 1, wherein the drain terminal of said PMOS transistor, and N-type semiconductor well, and said P-type carrier releasing region constitute a lateral bipolar junction transistor.

7. The CMOS integrated circuit as claimed in claim 1, wherein the P-type carrier-releasing region is between the PMOS transistor and the NMOS transistor without entirely surrounding the N-type semiconductor well to save layout space.

8. The CMOS integrated circuit as claimed in claim 1, wherein the P-type carrier-releasing region surrounds the N-type semiconductor well.

9. A CMOS integrated circuit, comprising:

a semiconductor layer of a first conductivity type;

an semiconductor well of a second conductivity type provided in said semiconductor layer of the first conductivity type with a junction therebetween;

a first MOS transistor formed in said semiconductor well of the second conductivity type, said first MOS transistor having its source terminal connected to a first voltage source;

a contact region formed in said semiconductor well of the second conductivity type and connected to said first voltage source;

a second MOS transistor formed in said semiconductor layer of the first conductivity type, said second MOS transistor having its source terminal connected to a second voltage source;

a contact region formed in said semiconductor layer of the first conductivity type and connected to said second voltage source; and a carrier-releasing region having one portion formed in said semiconductor well of the second conductivity type and another portion formed in said semiconductor layer of the first conductivity type to span said junction, said carrier releasing region being of said first conductivity type and being connected together with the contact region formed in said semiconductor layer of the first conductivity type to said second voltage source.

10. The CMOS integrated circuit as claimed in claim 9, wherein said first voltage source has a voltage level greater than said second voltage source.

11. The CMOS integrated circuit as claimed in claim 9, wherein said first and second MOS transistors have their gate terminals connected together to form an input terminal.

12. The CMOS integrated circuit as claimed in claim 9, wherein said first and second MOS transistors have their drain terminals connected together to form an output terminal.

13. The CMOS integrated circuit as claimed in claim 9, wherein said semiconductor layer of said first conductivity type is a semiconductor substrate.

14. The CMOS integrated circuit as claimed in claim 13, wherein said N-type semiconductor layer is an N-well formed in said P-type semiconductor substrate.

15. The CMOS integrated circuit as claimed in claim 9, wherein the carrier-releasing region is between the first MOS transistor and the second MOS transistor without entirely surrounding the semiconductor well to save layout space.

16. The CMOS integrated circuit as claimed in claim 9, wherein the carrier-releasing region surrounds the semiconductor well.

* * * * *